United States Patent [19]

Nakamura et al.

[11] Patent Number: 5,674,813
[45] Date of Patent: Oct. 7, 1997

[54] PROCESS FOR PREPARING LAYERED STRUCTURE INCLUDING OXIDE SUPER CONDUCTOR THIN FILM

[75] Inventors: Takao Nakamura; Michitomo Iiyama, both of Osaka, Japan

[73] Assignee: Sumitomo Electric Industries, Ltd., Osaka, Japan

[21] Appl. No.: 679,997

[22] Filed: Jul. 15, 1996

Related U.S. Application Data

[60] Continuation of Ser. No. 394,764, Feb. 27, 1995, abandoned, which is a division of Ser. No. 335,397, Nov. 3, 1994, Pat. No. 5,423,914.

[30] Foreign Application Priority Data

Nov. 4, 1993 [JP] Japan .................. 5-299028

[51] Int. Cl.$^6$ .................. C23C 14/24; B05D 5/12
[52] U.S. Cl. .................. 505/473; 505/732; 427/255.5; 427/255.7; 427/419.3; 427/126.3; 427/62
[58] Field of Search .................. 427/255.7, 255.5, 427/126.3, 419.3, 62; 505/473, 729, 732; 117/108; 118/719, 715, 725, 730

[56] References Cited

FOREIGN PATENT DOCUMENTS

467777A2  1/1992  European Pat. Off. .

OTHER PUBLICATIONS

Bodin et al, Jpn. J. Appl. Phys. vol. 31, Part 2, No. 7B Jul. 1992, pp. L949–L952.

Ohara et al, Appl Phys. Lett. 58(3) Jan. 1991, pp. 298–300.

Nakao et al, Jpn. J. Appl. Phys. 30(12B) Dec. 1991, pp. 3929–3932.

*Primary Examiner*—Roy V. King
*Attorney, Agent, or Firm*—Kerkam, Stowell, Kondracki & Clarke P.C.

[57] ABSTRACT

The invention provides a method for preparing a layered structure made up of a plurality of thin films composed of different compositions, in which the method involves using a reactive co-evaporation technique to deposit a first thin film on a substrate using a first set of evaporation sources, and then depositing another thin film of a different composition on the first thin film, using a second set of evaporation sources that has no evaporation sources common with the first set of evaporation sources. In the method, the first thin film is deposited in a first deposition sub-chamber and the second thin film is deposited in a second deposition subchamber, both of which are part of a single vacuum chamber.

6 Claims, 2 Drawing Sheets

PROCESS FOR PREPARING LAYERED STRUCTURE INCLUDING OXIDE SUPER CONDUCTOR THIN FILM

This is a continuation of application Ser. No. 08/394,764, filed Feb. 27, 1995, now abandoned, which is a divisional of Ser. No. 08/335,397 filed Nov. 3, 1994, now U.S. Pat. No. 5,423,914.

BACKGROUND OF THE INVENTION

1. Field of the Invention

The present invention relates to a film depositing apparatus and a process for preparing a layered structure including an oxide superconductor thin film, and more specifically to an improved film depositing apparatus particularly for preparing a layered structure including an oxide superconductor thin film and a dielectric thin film and/or an insulator thin film, which has a clear interface with negligible interface states, high crystallinity and excellent properties.

2. Description of Related Art

Oxide superconductors have been found to have higher critical temperatures than those of metal superconductors, and therefore considered to have good possibility of practical application. For example, Y—Ba—Cu—O type oxide superconductor has a critical temperature higher than 80 K and it is reported that Bi—Sr—Ca—Cu—O type oxide superconductor and Tl—Ba—Ca—Cu—O type oxide superconductor have critical temperatures higher than 100 K.

In case of applying the oxide superconductor to superconducting electronics including superconducting devices and superconducting integrated circuits, the oxide superconductor has to be used in the form of a thin film having a thickness of a few nanometers to some hundreds micrometers. It is considered to be preferable to utilize various deposition methods, such as sputtering methods, laser ablation methods and reactive co-evaporation methods for forming oxide superconductor thin films. In particular, it is possible to deposit an oxide superconductor thin film atomic layer by atomic layer through utilizing a reactive co-evaporation method. Additionally, in-situ observation during and between depositing thin film is possible so that a high quality oxide superconductor thin film can be obtained by the reactive co-evaporation method.

In order to deposit an oxide superconductor thin film on a substrate by the reactive co-evaporation method, constituent elements of the oxide superconductor excluding oxygen are supplied as molecular beams towards the substrate by using Knudsen's cell (abbreviated to K cell hereinafter) type molecular beam sources. In addition, an oxidizing gas such as $O_2$ including $O_3$, $NO_2$ or $N_2O$ is supplied near the substrate so that the molecular beams are oxidized so as to form the oxide superconductor thin film on the substrate. It is also possible to deposit high quality thin films of ferroelectrics such as $SrTiO_3$ and of nonsuperconducting oxide such as $Pr_1Ba_2Cu_3O_{7-y}$. Furthermore, by switching molecular beam sources, it is possible to deposit thin films of different materials or compositions successively so as to form a layered structure.

In U.S. patent application Ser. No. 07/987,756, Takao Nakamura discloses a film deposition apparatus suitable for depositing oxide thin films by the reactive co-evaporation method. This film deposition apparatus includes a vacuum chamber provided with a main evacuating apparatus, at least one K cell or at least one electron beam gun provided at a bottom of the vacuum chamber, and a sample holder provided at a top of the vacuum chamber for holding a substrate on which a film is to be deposited. The sample holder is associated with a heater for heating the substrate. In addition, the vacuum chamber is also provided with a liquid nitrogen shroud for forming a cold trap around an evaporation source of the K cell or electron beam gun, and a RHEED (Reflecting High Energy Electron Diffraction) device for evaluating a depositing thin film. In front of the substrate attached to the sample holder, a shutter is located for controlling a deposition time during the deposition process. The K cell and the electron beam gun are also provided with an operatable shutter.

In addition, a gas supplying apparatus is provided so as to introduce an oxidizing gas such as $O_2$, $O_3$, $NO_2$, $N_2O$, etc. in vicinity of the substrate attached to the sample holder, so that the oxidizing gas can be supplied to form an oxygen-enriched atmosphere in the vicinity of the substrate in order to oxidize molecular beams incoming from the molecular beam source in the course of the film deposition.

Furthermore, the film deposition apparatus additionally includes a partitioning plate for dividing the vacuum chamber into a first sub-chamber which is constituted of a lower portion of the vacuum chamber defined below the partitioning plate and which is coupled to the K cell, the electron beam gun and the main evacuating apparatus, and a second sub-chamber which is constituted of an upper portion of the vacuum chamber defined above the partitioning plate and in which sample holder is located. The partitioning plate includes a through opening formed at a center thereof. The position of the opening is determined to ensure that a beam emitted from K cell and the electron beam gun toward the substrate is not obstructed by the partitioning plate. In addition, the size of the opening is determined to enable restricted molecular flows, particularly of oxygen gas, from the second sub-chamber to the first sub-chamber so that a pressure difference can be created between the first sub-chamber and the second sub-chamber even if the opening is open. Therefore, the partitioning plate having the through opening constitutes a vacuum conductance.

A gate valve is provided on the partitioning plate for hermetically closing the opening of the partitioning plate, so as to completely shut off the molecular flows between the first sub-chamber and the second sub-chamber when the gate valve is closed. An opening and closing of this gate valve is controlled from the outside of the film deposition apparatus.

In addition, an auxiliary evacuating apparatus is attached to the second sub-chamber for evacuating the second sub-chamber to an ultra-high vacuum even if the gate valve is closed.

By using the above conventional film deposition apparatus, a high quality single oxide thin film of high crystallinity with excellent properties can be deposited. However, it is difficult to form a layered structure composed of a sharp and clean interface and thin films of different materials or compositions with excellent properties.

In the above film deposition apparatus, a composition of a deposited thin film is controlled by ratios of intensity of the molecular beams and the intensity of the molecular beams is controlled by temperatures of crucibles of the K cell type molecular beam sources. Therefore, accurate temperature controls of the crucibles are required when the or molecular beam sources are switched so as to deposit a different thin film.

Amounts of materials left in the crucibles and atmosphere around the molecular beam sources effects on the intensity of the molecular beams and temperature distributions of around the out lets of the crucibles are influenced by an operation of shutters. Therefore, the temperatures of the crucibles should be stabled before starting the deposition of a thin film. It takes long time to stabilize the temperatures of the crucibles so that process for forming a layered structure is interrupted when the molecular beam sources are switched so as to deposit a different thin film.

During the interruption, a lower thin film just deposited is maintained at the depositing temperature so that contaminants in the chamber may stick to a surface of the lower thin film or oxygen within the lower thin film may escape so as to diffuse into the chamber of ultra high vacuum.

In order to prevent the above phenomenon, it is proposed to stop heating the substrate during the interruption so as to lower the temperature of a lower thin film. However, in this case, a lower thin film is repeatedly heated and cooled so as to subject large thermal hysteresis which causes distortions and clacks of the thin film.

SUMMARY OF THE INVENTION

Accordingly, it is an object of the present invention to provide a film depositing apparatus, which has overcome the above mentioned defects of the conventional ones.

Another object of the present invention to provide a process for preparing a layered structure including an oxide superconductor thin film which has a clean and sharp interface, high crystallinity and excellent properties.

The above and other objects of the present invention are achieved in accordance with the present invention by a film deposition apparatus comprising:

a vacuum chamber provided with a partitioning means for dividing said vacuum chamber into a first sub-chamber and a second sub-chamber, said partitioning means including an opening for introducing a vacuum conductance for molecular flows between said first sub-chamber and said second sub-chamber so that a pressure difference can be created between said first sub-chamber and said second sub-chamber even when said opening is open;

a gate valve provided on said partitioning means for hermetically closing said opening of said partitioning means so as to shut off the molecular flows between said first sub-chamber and said second sub-chamber;

at least two evaporation source sets each comprising at least one K cell provided in said vacuum chamber in communication with an internal space of said vacuum chamber and designed to deposit a thin film at different deposition positions in said second sub-chamber;

a main evacuating means coupled to said first sub-chamber for evacuating said first sub-chamber to an ultra high vacuum;

a rotatable sample holder located within said second sub-chamber having at least two heads for holding substrate to be deposited so as to face different directions, said sample holder is rotatable so that said heads can be located at said different deposition positions;

means for heating said substrates;

a gas supplying means provided in said second sub-chamber so as to supply a predetermined gas to said second sub-chamber; and an auxiliary evacuating means coupled to said second sub-chamber for evacuating said second sub-chamber to an ultra-high vacuum even when said gate valve is closed.

In the apparatus in accordance with the present invention, all the molecular beam source sets can be provided in the first sub-chamber in communication with an internal space of the first sub-chamber.

According to another aspect of the present invention, there is provided a film deposition apparatus comprising:

a vacuum chamber provided with at least two deposition rooms arranged symmetrically and separated by a bulkhead;

each of said deposition rooms comprising:

a partitioning means for dividing said deposition room into a first sub-chamber and a second sub-chamber, said partitioning means including an opening for introducing a vacuum conductance for molecular flows between said first sub-chamber and said second sub-chamber so that a pressure difference can be created between said first sub-chamber and said second sub-chamber even when said opening is open;

a gate valve provided on said partitioning means for hermetically closing said opening of said partitioning means so as to shut off the molecular flows between said first sub-chamber and said second sub-chamber;

at least one evaporation source sets each comprising at least one K cell provided in said first sub-chamber in communication with an internal space of said first sub-chamber;

a main evacuating means coupled to said first sub-chamber for evacuating said first sub-chamber to an ultra high vacuum;

a gas supplying means provided in said second sub-chamber so as to supply a predetermined gas to said second sub-chamber; and an auxiliary evacuating means coupled to said second sub-chamber for evacuating said second sub-chamber to an ultra-high vacuum even when said gate valve is closed;

a rotatable sample holder located within said vacuum chamber having at least two heads for holding substrate to be deposited so as to face different directions, said sample holder is rotatable so that said heads can be located at deposition positions in second sub-chambers of the deposition rooms; and means for heating said substrates.

In a preferred embodiment, the oxide superconductor is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystallinity. Some other substrates with above insulating buffers are also applicable.

The above and other objects, features and advantages of the present invention will be apparent from the following description of preferred embodiments of the invention with reference to the accompanying drawings.

DESCRIPTION OF THE PREFERRED EMBODIMENTS

Figure 1:
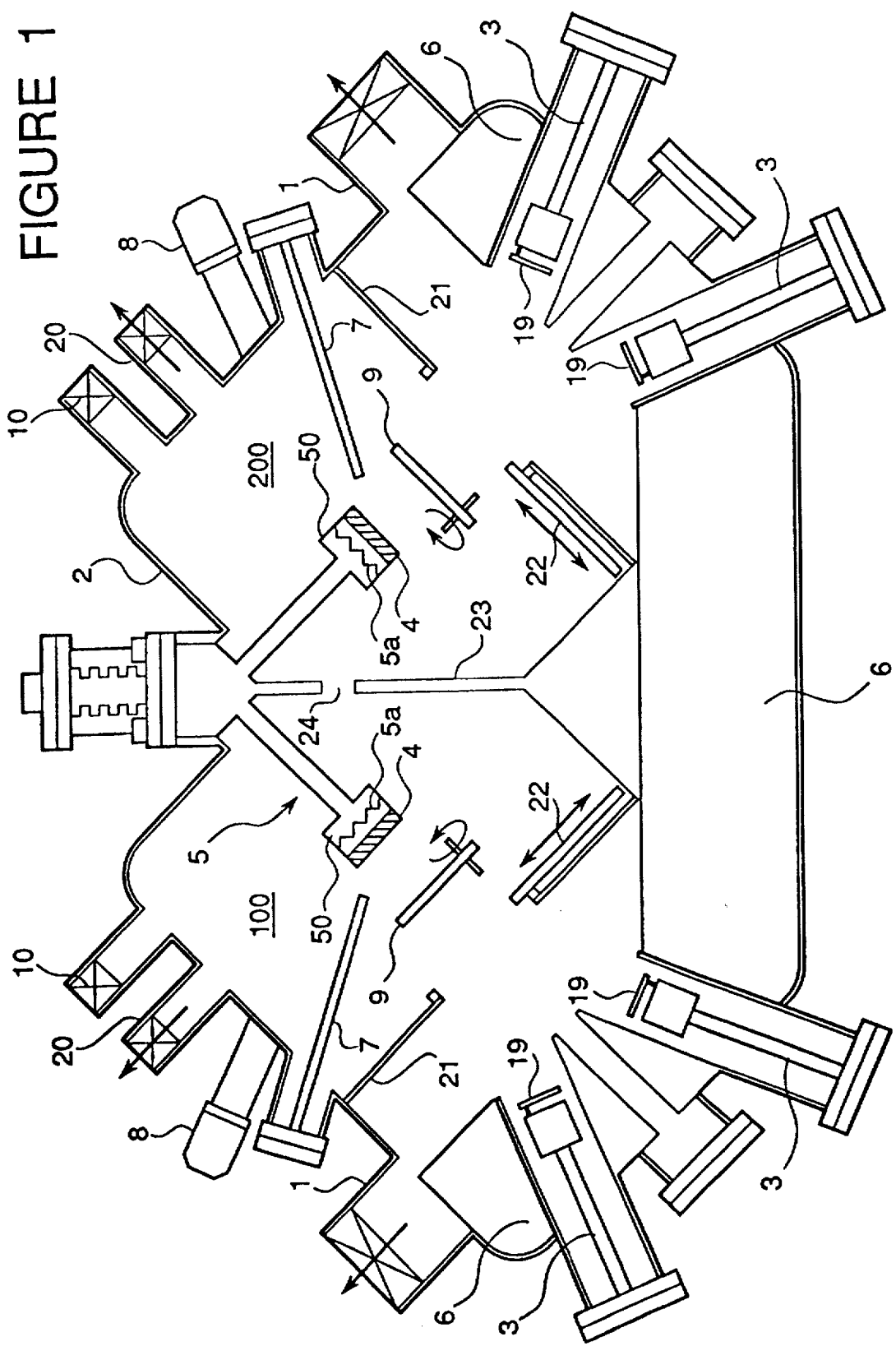
FIG. 1 is a diagrammatic sectional view of a first embodiment of the film deposition apparatus in accordance with the present invention.

Referring to FIG. 1 there is shown a diagrammatic sectional view of a first embodiment of the film deposition apparatus in accordance with the present invention.

The shown film deposition apparatus basically includes a vacuum chamber 2 comprising twin deposition rooms 100 and 200 symmetrically arranged and communicating by a through hole 24 on a bulkhead 23 with each other. The deposition rooms 100 and 200 are designed in the same way excluding the symmetrical arrangement.

Each of the deposition rooms 100 and 200 is provided with a main evacuating apparatus 1, at least one K (Knudsen's) cell 3 provided at a bottom of each deposition room as an evaporation source or a molecular beam source. A bifurcate sample holder 5 is provided at a top of the vacuum chamber 2, where each head 50 holds a substrate 4 on which a film is to be deposited. The bifurcate sample holder 5 is rotatable around a symmetrical axis of the vacuum chamber 2 so that the heads 50 can be aligned at deposition positions in the deposition rooms 100 and 200. The bifurcate sample holder 5 is associated with heaters 5a for heating the attached substrates 4 to its heads 50. Liquid nitrogen shrouds 6 for forming cold traps are disposed at a bottom of the vacuum chamber 2 and around evaporation sources of the K cells 3.

In addition, each of the deposition rooms 100 and 200 is also provided with a port 10 for exchanging a sample, and a RHEED (Reflecting High Energy Electron Diffraction) device 8 for evaluating a film surface roughness during the deposition. In front of the substrate 4 attached to the head 50 of the sample holder 5, a shutter 9 is located for controlling a deposition time during the deposition process. The K cells 3 are also provided with operatable shutters 19.

Additionally, a gas supplying apparatus 7 is provided so as to introduce an oxidizing gas such as $O_2$, $O_3$, $NO_2$, $N_2O$, etc. in vicinity of the substrate 4 attached to the head 50 of the sample holder 5, so that the oxidizing gas can be supplied to form an oxygen-enriched atmosphere in the vicinity of the substrate 4 in order to oxidize molecular beams incoming from the evaporation source in the course of the film deposition.

Furthermore, each of the deposition rooms 100 and 200 of the film deposition apparatus additionally includes a partitioning plate 21 for dividing the vacuum chamber 2 into a first sub-chamber which is constituted of a lower portion of the vacuum chamber defined below the partitioning plate 21 and which is coupled to the K cell 3 and the main evacuating apparatus 1, and a second sub-chamber which is constituted of an upper portion of the vacuum chamber defined above the partitioning plate 21 and in which the head 50 of the sample holder 5 is located. The partitioning plate 21 includes a through opening formed at a center thereof. The position of the opening is determined to ensure that a beam emitted from K cells 3 toward the substrate 4 is not obstructed by the partitioning plate 21. In addition, the size of the opening is determined to enable restricted molecular flows, particularly oxidation gases, from the second sub-chamber to the first sub-chamber so that a pressure difference can be created between the first sub-chamber and the second sub-chamber even if the opening is open. Therefore, the partitioning plate 21 having the through opening constitutes a vacuum conductance.

A gate valve 22 is provided on the partitioning plate 21 for hermetically closing the opening of the partitioning plate 21, so as to completely shut off the molecular flows between the first sub-chamber and the second sub-chamber when the gate valve 22 is closed. An opening and closing of this gate valve 22 is controlled from the outside of the film deposition apparatus by a not-shown means.

In addition, an auxiliary evacuating apparatus 20 is coupled to the second sub-chamber for evacuating the second sub-chamber to an ultrahigh vacuum when the gate valve 22 is closed. The auxiliary evacuating apparatus 20 is constituted of a cryopump. On the other hand, the main evacuating apparatus 1 is constituted of a diffusion pump.

The above film deposition apparatus comprises the two deposition rooms 100 and 200. However, the number of deposition rooms are not limited two. The film deposition apparatus may comprise more than two deposition rooms.

Figure 2:
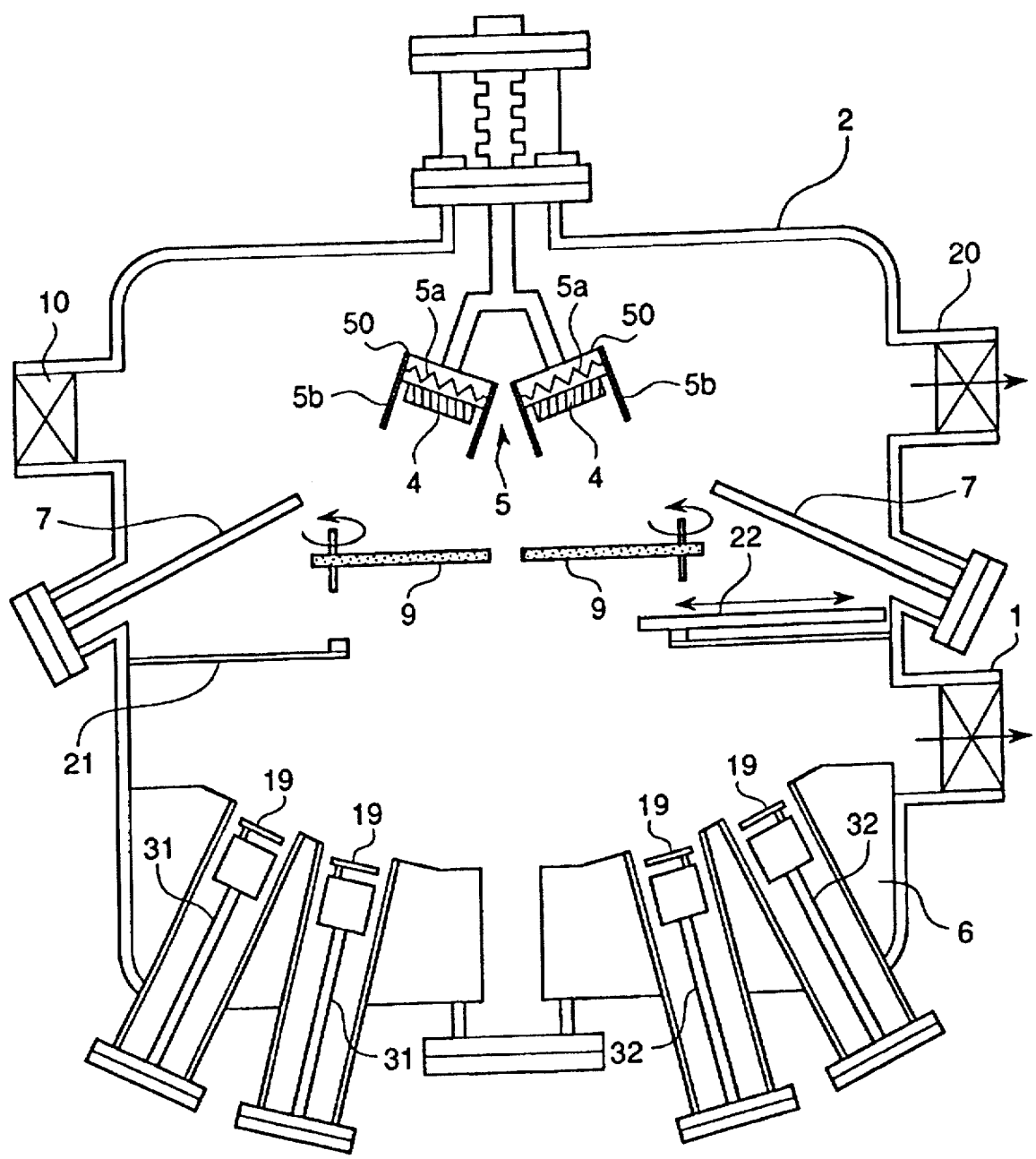
FIG. 2 is a diagrammatic sectional view of a second embodiment of the film deposition apparatus in accordance with the present invention.

Referring to FIG. 2 there is shown a diagrammatic sectional view of a second embodiment of the film deposition apparatus in accordance with the present invention.

The shown film deposition apparatus basically includes a vacuum chamber 2 similar to the deposition rooms 100 or 200 of FIG. 1 provided with a main evacuating apparatus 1, two sets of K cells 31 and 32 provided at a bottom of the vacuum chamber 2, and a bifurcate sample holder 5 provided at a top of the vacuum chamber 2, each head 50 of which holds a substrate 4 on which a film is to be deposited. The heads 50 of the bifurcate sample holder 5 hold substrates 4 so as to face different directions. The substrates 4 respectively correspond to the sets of the K cells 31 and 32 when the heads 50 are situated at deposition positions. Namely, K cells 31 are arranged to concentrate emitting molecular beams on a left side substrate 4 so as to deposit a thin film on it and K cells 32 are arranged to concentrate emitting molecular beams on a right side substrate 4 so as to deposit a thin film on it when the heads 50 are situated at the deposition positions. Each head 50 of the bifurcate sample holder 5 is associated with a heater 5a for heating the substrate and shield 5b avoiding incidence of molecular beams from a non-corresponding set of the K cells. The bifurcate sample holder 5 is rotatable on its axis so that the heads 50 can be located at the both deposition positions corresponding to the sets of the K cells 31 and 32. Of course, the sample holder 5 can branch into three or more so that each branch has a head corresponding to a set of K cells.

In addition, the vacuum chamber 2 is also provided with a port 10 for exchanging a sample, a liquid nitrogen shroud 6 for forming a cold trap around evaporation sources of the K cells 31 and 32. In front of the substrates 4 attached to the heads 50 of the bifurcate sample holder 50, shutters 9 are located for controlling a deposition time during the deposition process. The K cells 31 and 32 are provided with an operatable shutter 19. There also can be provided with a RHEED device, as shown in FIG. 1, for evaluating a thin film surface roughness during the deposition (not shown in FIG. 2).

Other parts of this film deposition apparatus is the same as those of the deposition rooms 100 or 200 of FIG. 1 so that explanation can be omitted.

EXAMPLE

A layered structure of a lower thin film of $Y_1Ba_2Cu_3O_{7-\delta}$ oxide superconductor and an upper thin film of $SrTiO_3$ dielectric oxide was formed on a $SrTiO_3$ (100) substrate by using the apparatus of FIG. 1.

At first, a $SrTiO_3$ (100) substrate 4 was set to the head 50 of the sample holder 5 located at the deposition room 100, and metal yttrium, metal barium and metal copper were set to three K cells 3 of the deposition room 100 as evaporation sources. A dummy substrate was set to the other head 50 of the sample holder 5 positioned to the deposition room 200. Metal strontium and metal titanium were set to two K cells 3 of the deposition room 200 as evaporation sources. Thereafter, the chamber 2 was closed and the gate valves 22 were opened. The deposition rooms 100 and 200 of vacuum chamber 2 were evacuated by the main evacuating apparatuses 1 and the auxiliary evacuating apparatuses 20 to an ultra-high vacuum of which the pressure was lower than $1 \times 10^{-10}$ Torr in which background pressure the film deposition by the co-evaporation process was conducted. Succeedingly, $O_2$ gas including more than 70 volume percent $O_3$ was supplied from the gas supplying device 7 of the deposition room 100 so that the pressure in the second sub-chamber of the deposition room 100 became $5 \times 10^{-5}$ Torr. As mentioned above, the deposition room 100 was provided with the vacuum conductance (the partitioning plate 21 having the through opening), a pressure difference of about one digit or more was created between the first sub-chamber and the second sub-chamber. In addition, the oxidizing gas injected from the gas supplying device 7 was irradiated onto a deposition surface of the substrate 4, the pressure of the oxidizing gas on the deposition surface of the substrate 4 was maintained much higher.

Then, the substrate 4 was heated by the heater 5a to a temperature of 700° C. The K cell 3 of metal yttrium was heated to a temperature of 1220° C., the K cell 3 of metal barium was heated to a temperature of 620° C. and the K cell 3 of metal copper was heated to a temperature of 1000° C. Precise control of each flux of the molecular beam was conducted by way of adjusting crucible temperature for stoichiometric deposition. When the influx of the molecular beams had become to be stable from the evaporation sources after the shutters 19 were opened, the shutter 9 of the deposition room 100 was opened so as to start deposition of the oxide superconductor thin film onto the substrate 4. At this time, a surface roughness of this deposited film was evaluated by the RHEED device. The oxide superconductor thin film was grown up to a thickness of 50 nanometers at a deposition rate of 1 nanometer/minute. The deposition rate is preferably 0.5 to 2 nanometers/minute.

Until the oxide superconductor thin film was finished to be deposited in the deposition room 100, the K cell 3 of metal strontium was heated to a temperature of 520° C. and the K cell 3 of metal titanium was heated to a temperature of 1500° C. so as to generate molecular beams with stable operation for stoichiometric deposition. The temperature of metal strontium is preferably 450° to 600° C. and the temperature of metal titanium is preferably 1430° C. to 1550° C. In addition, $O_2$ gas including more than 70 volume percent $O_3$ was supplied from the gas supplying device 7 of the deposition room 200 so that the pressure in the second chamber of the deposition room 200 became $3 \times 10^{-5}$ Torr.

When the oxide superconductor thin film had reached a thickness of 50 nanometers so as to complete deposition of the oxide superconductor thin film, the sample holder 5 was rotated to transport the $SrTiO_3$ (100) substrate 4 on which the superconductor thin film was deposited to the deposition room 200. The substrate 4 was cooled down to a temperature of 480° C. the shutter 9 of the deposition room 200 was opened so as to start deposition of the $SrTiO_3$ dielectric film onto the oxide superconductor thin film. The substrate temperature is preferably 430° to 580° C.

At this time, a surface roughness of this deposited film was evaluated by the RHEED device. The dielectric oxide thin film was grown up to a thickness of 250 nanometers at a deposition rate of 1.2 nanometer/minute. The deposition rate is preferably 0.5 to 2 nanometers/minute.

When the dielectric oxide thin film has reached a thickness of 250 nanometers, the substrate 4 was cooled down to the room temperature. While the substrate 4 was cooled down, oxygen supply was maintained in the condition in which the dielectric oxide thin film was deposited.

After the layered structure of the oxide superconductor thin film and the dielectric film was obtained, crystal structures, surface and interface properties of the layered structure was were evaluated by LEED and XPS without exposing the oxide superconductor thin film to the air. It was confirmed that the oxide superconductor thin film was a c-axis orientated $Y_1Ba_2Cu_3O_{7-\delta}$ oxide superconductor thin film and has high crystallinity. It was also revealed that the dielectric oxide thin film of the upper layer of the layered structure had a crystalline smooth surface and an interface between the oxide superconductor thin film and the dielectric oxide thin film was defined sharply.

As explained above, a layered structure of an oxide superconductor thin film and a thin film of a different material or composition having an excellent surface cleanness and roughness, high crystallinity and a sharp interface can be obtained by the process using the apparatus in accordance with the present invention. It can be also used more than three layer deposition, which can reduce the interdiffusion between bottom layers. The layered structure can be favorably applied to superconducting devices.

The invention has thus been shown and described with reference to the specific embodiments. However, it should be noted that the present invention is in no way limited to the details of the illustrated structures but converts and modifications may be made within the scope of the appended claims.

We claim:

1. A process for preparing a layered structure comprising thin films composed of different compositions or materials on a substrate by a reactive co-evaporation method comprising the steps of depositing a first thin film on said substrate using a first set of evaporation sources and depositing a second thin film of a different composition on the deposited first thin film using a second set of evaporation sources, said first and said second set of evaporation sources having no evaporation source common to both sets, and wherein said first thin film and said second thin film are deposited sequentially within a single vacuum chamber, and wherein each of said first and said second set of evaporation sources has a corresponding deposition position within said chamber at which the layered structure is positioned for deposition of said thin films; and wherein said process further comprises the step of moving said substrate from a first deposition position where said first thin film is deposited to a second deposition position within said vacuum chamber where said second thin film is deposited.

2. A process as claimed in claim 1, wherein molecular beams from said first set of said evaporation sources is not obstructed when said substrate is positioned at said first deposition position, and wherein molecular beams from said second set of evaporation sources is not obstructed when said substrate is positioned at said second deposition position.

3. A process as claimed in claim 1, wherein both said first and said second sets of said evaporation sources are kept under a stable temperature condition for a sufficient time before deposition so as to avoid fluctuations of molecular beams during deposition.

4. A process as claimed in claim 1, wherein both said first and said second sets of said evaporation sources are kept under a condition wherein they emit constant molecular beams regardless of whether said substrate is situated at a corresponding deposition position.

5. A process as claimed in claim 1, wherein one set of said first and said second sets of said evaporation sources is used for depositing a thin film of $Y_1Ba_2Cu_3O_{7-\delta}$ oxide superconductor and the other set of said evaporation sources is used for depositing a thin film of $SrTiO_3$ dielectric oxide.

6. A process as claimed in claim 5, wherein said process is used to form a layered structure having a lower first thin film of $Y_1Ba_2Cu_3O_{7-\delta}$ oxide superconductor and an upper second thin film of $SrTiO_3$ dielectric oxide.

* * * * *